United States Patent
Sugisawa

(10) Patent No.: US 11,843,096 B2
(45) Date of Patent: Dec. 12, 2023

(54) INTERNAL RESISTANCE DETECTION DEVICE AND POWER SOURCE DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Yuuki Sugisawa, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 487 days.

(21) Appl. No.: 17/266,359

(22) PCT Filed: Aug. 1, 2019

(86) PCT No.: PCT/JP2019/030241
§ 371 (c)(1),
(2) Date: Feb. 5, 2021

(87) PCT Pub. No.: WO2020/039881
PCT Pub. Date: Feb. 27, 2020

(65) Prior Publication Data
US 2021/0311100 A1    Oct. 7, 2021

(30) Foreign Application Priority Data
Aug. 22, 2018 (JP) ................................. 2018-155223

(51) Int. Cl.
*H01M 10/44* (2006.01)
*G01R 31/389* (2019.01)
(Continued)

(52) U.S. Cl.
CPC ............ *H01M 10/44* (2013.01); *G01R 27/08* (2013.01); *G01R 31/389* (2019.01); *H01M 10/48* (2013.01); *H02J 7/007182* (2020.01)

(58) Field of Classification Search
CPC ...................................................... H01M 10/44
(Continued)

(56) References Cited

U.S. PATENT DOCUMENTS 6,563,318 B2 * 5/2003 Kawakami ........... G01R 31/389
324/426
8,552,688 B2 * 10/2013 Ueda ..................... B60W 10/06
320/132

(Continued)

FOREIGN PATENT DOCUMENTS

JP    H8-136629 A    5/1996
JP    2008-64700 A    3/2008
(Continued)

OTHER PUBLICATIONS

International Search Report, Application No. PCT/JP2019/030241, dated Sep. 24, 2019. ISA/Japan Patent Office.

*Primary Examiner* — Jerry D Robbins
(74) *Attorney, Agent, or Firm* — Honigman LLP

(57) ABSTRACT

Provided is a configuration that can detect the internal resistance of a power storage unit. An internal resistance detection device includes a DC-DC converter that is configured to raise the output voltage to a target voltage by performing constant current operation in which the charging current is output at a target charging current, and, when the output voltage reaches the target voltage, to control power such that the charging current is lowered by performing constant voltage operation in which the output voltage is fixed at the target voltage. A control unit detects the internal resistance of a power storage unit based on a target charging current Ichg during constant current operation by the DC-
(Continued)

DC converter, a drop time, which is the time that passes from when constant voltage operation starts to when the charging current drops to a predetermined current value, and a capacity of the power storage unit.

8 Claims, 3 Drawing Sheets

(51) Int. Cl.
     *H02J 7/00*          (2006.01)
     *G01R 27/08*       (2006.01)
     *H01M 10/48*      (2006.01)

(58) Field of Classification Search
     USPC .......................................................... 320/132
     See application file for complete search history.

(56) References Cited

U.S. PATENT DOCUMENTS

2003/0006735 A1*   1/2003   Kawakami ......... G01R 31/3828
                                                                               320/133
2012/0306450 A1    12/2012   Nakayama et al.

FOREIGN PATENT DOCUMENTS

| | | |
|---|---|---|
| JP | 2011-43460 A | 3/2011 |
| JP | 2012-202687 A | 10/2012 |
| JP | 2018-68081 A | 4/2018 |

* cited by examiner

INTERNAL RESISTANCE DETECTION DEVICE AND POWER SOURCE DEVICE

CROSS-REFERENCE TO RELATED APPLICATIONS

This application is the U.S. national stage of PCT/JP2019/030241 filed on Aug. 1, 2019, which claims priority of Japanese Patent Application No. JP 2018-155223 filed on Aug. 22, 2018, the contents of which are incorporated herein.

TECHNICAL FIELD

The present disclosure relates to an internal resistance detection device and a power source device.

BACKGROUND

As a power source system for a vehicle, a configuration is known that includes a main power source that is constituted by a lead storage battery or the like, and an auxiliary power source that is constituted by an electric double layer capacitor, a lithium-ion capacitor, or the like. This ensures safety during driving because the necessary power is supplied from the auxiliary power source to the electrical load when the main power source fails. Capacitors degrade over time, and therefore there is a need to regularly detect the state of degradation and to check whether or not the capacitor can function as an auxiliary power source.

For example, JP 2008-64700A discloses an internal resistance measuring device that is configured to connect an external resistor in series with an electric double layer capacitor and measure the voltage of both ends of the electric double layer capacitor and the external resistor that are connected in series. In order for the internal resistance measuring device to measure the internal resistance of the capacitor, voltage drop is made to occur by switching to constant current discharge after the voltage of both ends of the capacitor reaches a predetermined charging voltage. The internal resistance measuring device then calculates the internal resistance based on the voltage drop of the end-to-end voltage of the capacitor and the discharge current that flows through the capacitor.

However, the internal resistance measuring device of JP 2008-64700A causes voltage drop when the capacitor is performing charging control and performs processing to calculate the internal resistance. Causing temporary voltage drop during charging control in this manner causes an increase in the time it takes for the capacitor to be charged to the charging target voltage thereof. On the other hand, a configuration is conceivable in which the internal resistance is calculated each time the power source system is initialized before charging control of the capacitor is performed, but this configuration also increases the time it takes until starting normal operations such as charging control. This results in an increase in the time it takes for the capacitor to reach the charging target voltage thereof.

The present disclosure was created in order to solve at least one of the problems described above, and an object thereof is to provide a configuration in which the internal resistance of a power storage unit can be efficiently and accurately detected.

SUMMARY

An internal resistance detection device of a first aspect of the present disclosure is configured to detect an internal resistance of a power storage unit in an in-vehicle power source system that includes a power source unit and the power storage unit configured to be charged based on power from the power source unit, the internal resistance detection device including: a current detection unit configured to detect a current that flows through a predetermined conduction path that is a path with which power is supplied from the power source unit to the power storage unit; a charging circuit unit configured to convert power from the power source unit and to supply charging current to the power storage unit; and an internal resistance detection portion configured to detect an internal resistance of the power storage unit. The charging circuit unit is configured to raise an output voltage to a target voltage by performing constant current operation in which the charging current is output at a target charging current, and, when the output voltage reaches the target voltage, to control power such that the charging current is lowered by performing constant voltage operation in which the output voltage is fixed at the target voltage. The internal resistance detection unit is configured to detect the internal resistance of the power storage unit based on the target charging current, a drop time, which is the time that passes from when constant voltage operation starts to when the charging current drops to a predetermined current value, and a capacity of the power storage unit.

A power source device according to a second aspect of the present disclosure includes the power storage unit and the internal resistance detection device.

Advantageous Effects of Disclosure

The internal resistance detection unit of the internal resistance detection device described above detects the internal resistance of the power storage unit based on the target charging current during constant current operation by the charging circuit unit, drop time, which is the time that passes from when constant voltage operation starts to when the charging current drops to a predetermined current value, and the capacity of the power storage unit. For this reason, the target charging current during constant current operation by the charging circuit unit, drop time, which is the time that passes from when constant voltage operation starts to when the charging current drops to a predetermined current value, and the capacity of the power storage unit can be reflected and the internal resistance of the power storage unit can be accurately detected.

Also, the internal resistance detection unit detects the internal resistance of the power storage unit based on the drop time and the current that is detected after constant voltage operation is started by the charging circuit unit, and therefore the internal resistance detection unit can use the time of constant voltage operation performed by the charging circuit unit to detect the internal resistance of the power storage unit. Thus, at the stages before the power storage unit is charged or while the power storage unit is being charged, there is no need to perform control to detect the internal resistance of the power storage unit, and there is no need to separately secure time to perform such control. In this way, it is possible to decrease the time needed to cause the charging circuit unit to perform constant current operation and constant voltage operation and completely charge the power storage unit.

Accordingly, the internal resistance detection device can detect the internal resistance of the power storage unit efficiently and accurately.

The power source device of the second aspect can exhibit effects that are similar to those of the internal resistance detection device of the first aspect.

DETAILED DESCRIPTION OF PREFERRED EMBODIMENTS

The following are desirable examples of the present disclosure. However, the present disclosure is not limited to the following examples.

The internal resistance detection unit may also be configured such that the internal resistance detection unit is configured to detect the internal resistance of the power storage unit by using a formula $I=I_{chg} \times \exp(-\Delta t2/RC)$, which is a formula of the current detected by the current detection unit when the drop time has passed, where $I_{chg}$ is the target charging current, $\Delta t2$ is the drop time, C is the capacity of the power storage unit, and R is the internal resistance of the power storage unit.

In this way, in the detection of the internal resistance of the power storage unit, it is possible to more accurately detect the internal resistance of the power storage unit by using $I=I_{chg} \times \exp(-\Delta t2/RC)$, which is a formula of the current detected by the current detection unit when a predetermined amount of time has passed after the charging circuit unit starts constant voltage operation.

The internal resistance detection device may also be configured to include a voltage detection unit configured to detect the output voltage of the charging circuit unit. The internal resistance detection device may also be configured to include a capacity detection unit configured to detect the capacity of the power storage unit based on changes in the output voltage detected by the voltage detection unit due to a predetermined capacity detection time passing when the charging circuit unit is performing constant current operation, and the charging current that is detected by the current detection unit while the capacity detection time passes. The internal resistance detection unit may also detect the internal resistance of the power storage unit based on the target charging current, the drop time, and the capacity of the power storage unit detected by the capacity detection unit.

In this way, during constant current operation before constant voltage operation performed by the charging circuit unit, the capacity of the power storage unit can be detected by the capacity detection unit based on the change of the output voltage detected by the voltage detection unit and the charging current detected by the current detection unit. For this reason, it is possible to perform capacity detection that is highly accurate and that reflects the state of the power storage unit immediately before detecting the internal resistance thereof. Also, it is possible to more accurately detect the internal resistance of the power storage unit by using the capacity thereof that is precisely detected.

First Embodiment

The following describes a First Embodiment that embodies the present disclosure.

Figure 1:
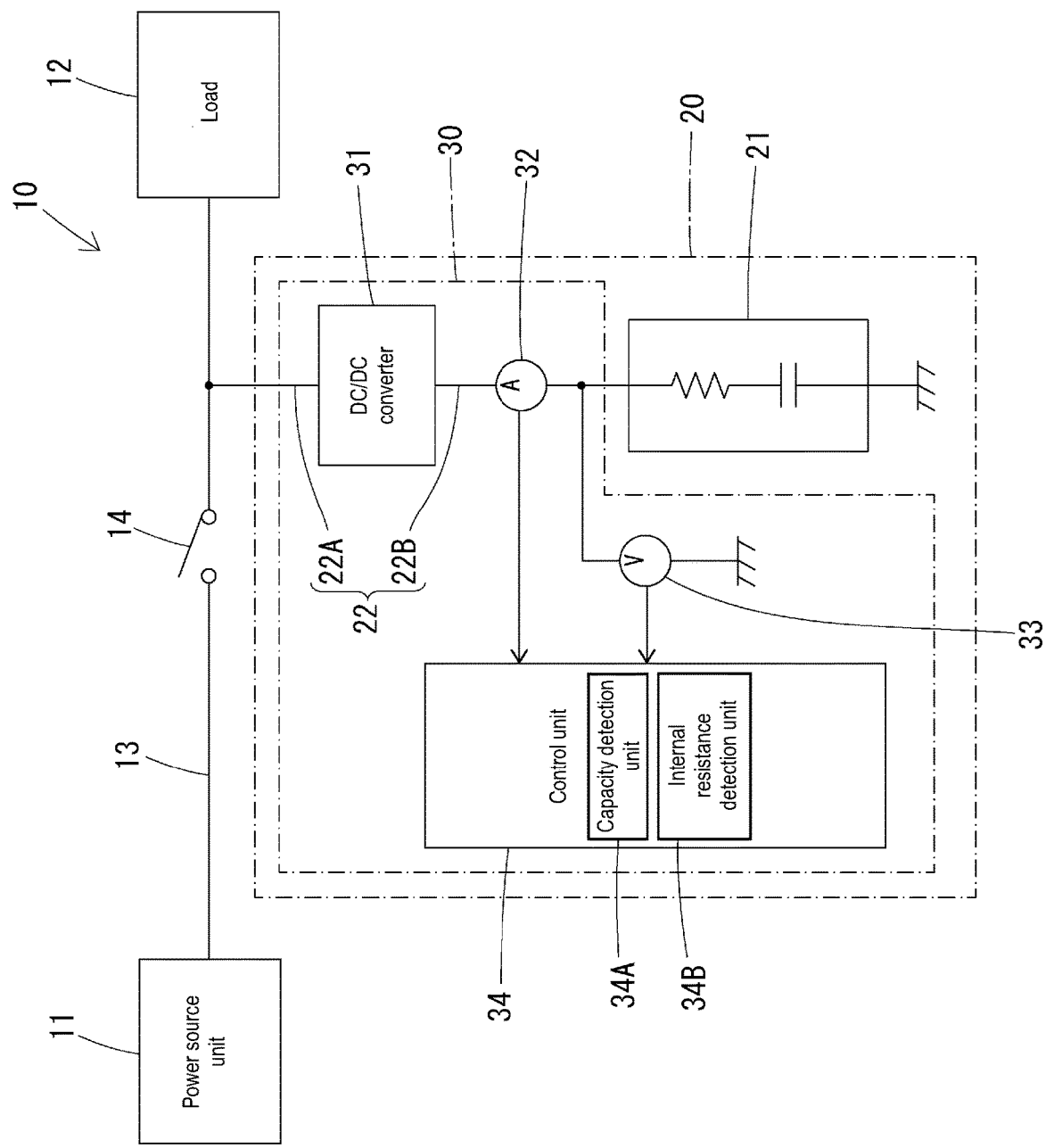
FIG. 1 is a block diagram schematically showing an example of a configuration of an in-vehicle power source system of a first embodiment.

An in-vehicle power source system 10 (hereinafter also referred to as "system 10") shown in FIG. 1 is configured as a power source system that supplies power to an in-vehicle load 12 (hereinafter also referred to as "load 12"). As shown in FIG. 1, the system 10 includes a power source unit 11, an auxiliary power source device 20, a conduction path 13, and a switch 14. The power source unit 11 is the main source of power to be supplied to the load 12. The auxiliary power source device 20 is a source of power that is different to the power source unit 11. The conduction path 13 is a path through which power is supplied from the power source unit 11 to the load 12. The switch 14 is provided on the conduction path 13.

The system 10, for example, supplies power from the power source unit 11 to the load 12 and the auxiliary power source device 20 when the supply of power from the power source unit 11 is normal, and supplies power from the auxiliary power source device 20 to the load 12 and the power source unit 11 when the supply of power from the power source unit 11 has become abnormal.

The power source unit 11 may be constituted by a known power storage means such as a lead storage battery, a lithium ion battery, an electric double layer capacitor, a lithium-ion capacitor, or another type power storage unit. The power source unit 11 includes a terminal on the high-potential side that is electrically connected to the conduction path 13, and applies a predetermined output voltage (12 V, for example) to the conduction path 13. A terminal on the low-potential side of the power source unit 11 is electrically connected to a ground portion that is provided in the vehicle. Also, the power source unit 11 is electrically connected to a generator (not shown) and can be charged with power from the generator.

The auxiliary power source device 20 is equivalent to an example of a power source device, and includes a power storage unit 21, a conduction path 22, and an internal resistance detection device 30. The power storage unit 21 may be constituted by a known capacitor such as an electric double layer capacitor and a lithium-ion capacitor. The power storage unit 21 is configured to be charged based on power from the power source unit 11. The power storage unit 21 has a terminal on the high-potential side that is electrically connected to the conduction path 22. A terminal on the low-potential side of the power storage unit 21 is electrically connected to the ground portion that is provided in the vehicle. The conduction path 22 has one end connected to the conduction path 13 and is a path through which power is supplied from the power source unit 11 to the power storage unit 21. The conduction path 22 is constituted by conduction paths 22A and 22B. One end of the conduction path 22A is connected to the conduction path 13, and the other end of the conduction path 22A is connected to a DC-DC converter 31, which will be described later. One end of the conduction path 22B is connected to the DC-DC converter 31, which will be described later, and the other end of the conduction path 22B is connected to the power storage unit 21.

The internal resistance detection device 30 functions to detect the internal resistance of the power storage unit 21. The internal resistance detection device 30 is equipped with the automotive DC-DC converter 31 (hereinafter also referred to as "DC-DC converter 31"), a current detection unit 32, a voltage detection unit 33, and the control unit 34. The DC-DC converter 31 is equivalent to an example of a charging circuit unit, and is constituted by a known DC-DC converter. The DC-DC converter 31 is provided on the conduction path 22. The DC-DC converter 31 is configured with either one of the conduction path 22A and the conduction path 22B serving as an input conduction path, the other one of the conduction path 22A and the conduction path 22B serving as an output conduction path, and steps-up or steps-down the DC voltage that is applied to the input conduction path and outputs the DC voltage to the output conduction path. In the First Embodiment, the DC-DC converter 31 functions to convert power from the power source unit 11 and supply charging current to the power storage unit 21. Specifically, DC-DC converter 31 is configured to raise the output voltage to a target voltage by performing constant current operation in which the charging current is output at a target charging current, and, when the output voltage reaches the target voltage, to control power such that the charging current is lowered by performing constant voltage operation in which the output voltage is fixed at the target voltage.

The current detection unit 32 is constituted by a known current detection circuit. The current detection unit 32 is a current detection circuit that detects the current (the charging current supplied to the power storage unit 21) that flows through the conduction path 22B, and may be constituted by, for example, a shunt resistor provided on the conduction path 22B and a differential amplifier that amplifies the end-to-end voltage of the shunt resistor and outputs the amplified voltage. The control unit 34 specifies the value of the current that flows through the conduction path 22B based on the value (detection value of the current detection unit 32) that is input from the current detection unit 32.

The voltage detection unit 33 functions to detect the output voltage of the DC-DC converter 31. The voltage detection unit 33 is constituted by a known voltage detection circuit. The voltage detection unit 33 is provided on the conduction path 22B and detects the voltage that is applied to the conduction path 22B. The voltage detection unit 33 inputs a value (such as a voltage value of the conduction path 22B, or a value obtained by the voltage value of the conduction path 22B being divided by a voltage-dividing circuit) indicating the voltage of the conduction path 22B to the control unit 34 as a detection value. The control unit 34 can specify the voltage value of the conduction path 22B based on the value (detection value of the voltage detection unit 33) input from the voltage detection unit 33.

The control unit 34 controls the operation of the DC-DC converter 31 and the like. The control unit 34 may be constituted by a microcomputer or the like, and includes an arithmetic device such as a CPU, memory such as ROM or RAM, and the like. The control unit 34 operates with use of power supplied from the power source unit 11 or the power storage unit 21. Specifically, the control unit 34. Specifically, the control unit 34 causes the DC-DC converter 31 raise the output voltage to a target voltage by causing the DC-DC converter 31 to perform constant current operation in which the charging current is output at a target charging current, and, when the output voltage reaches the target voltage, causes the DC-DC converter 31 to control power such that the charging current is lowered by causing the DC-DC converter 31 to perform constant voltage operation in which the output voltage is fixed at the target voltage.

The control unit 34 functions as a capacity detection unit 34A and an internal resistance detection unit 34B. The capacity detection unit 34A and the internal resistance detection unit 34B may be realized by software processing with use of an information processing device, or may be realized by a hardware circuit. The capacity detection unit 34A detects the capacity of the power storage unit 21. Specifically, the capacity detection unit 34A. Specifically, the capacity detection unit 34A is configured to detect the capacity of the power storage unit 21 based on changes in the output voltage detected by the voltage detection unit 33 due to a predetermined capacity detection time passing when the DC-DC converter 31 is performing constant current operation, and the charging current that is detected by the current detection unit 32 while the capacity detection time passes.

The internal resistance detection unit 34B detects the internal resistance of the power storage unit 21 based on the target charging current during constant current operation performed by the DC-DC converter 31, drop time, which is the time that passes from when constant voltage operation starts to when the charging current drops to a predetermined current value, and the capacity of the power storage unit 21 detected by the capacity detection unit 34A.

Figure 2:
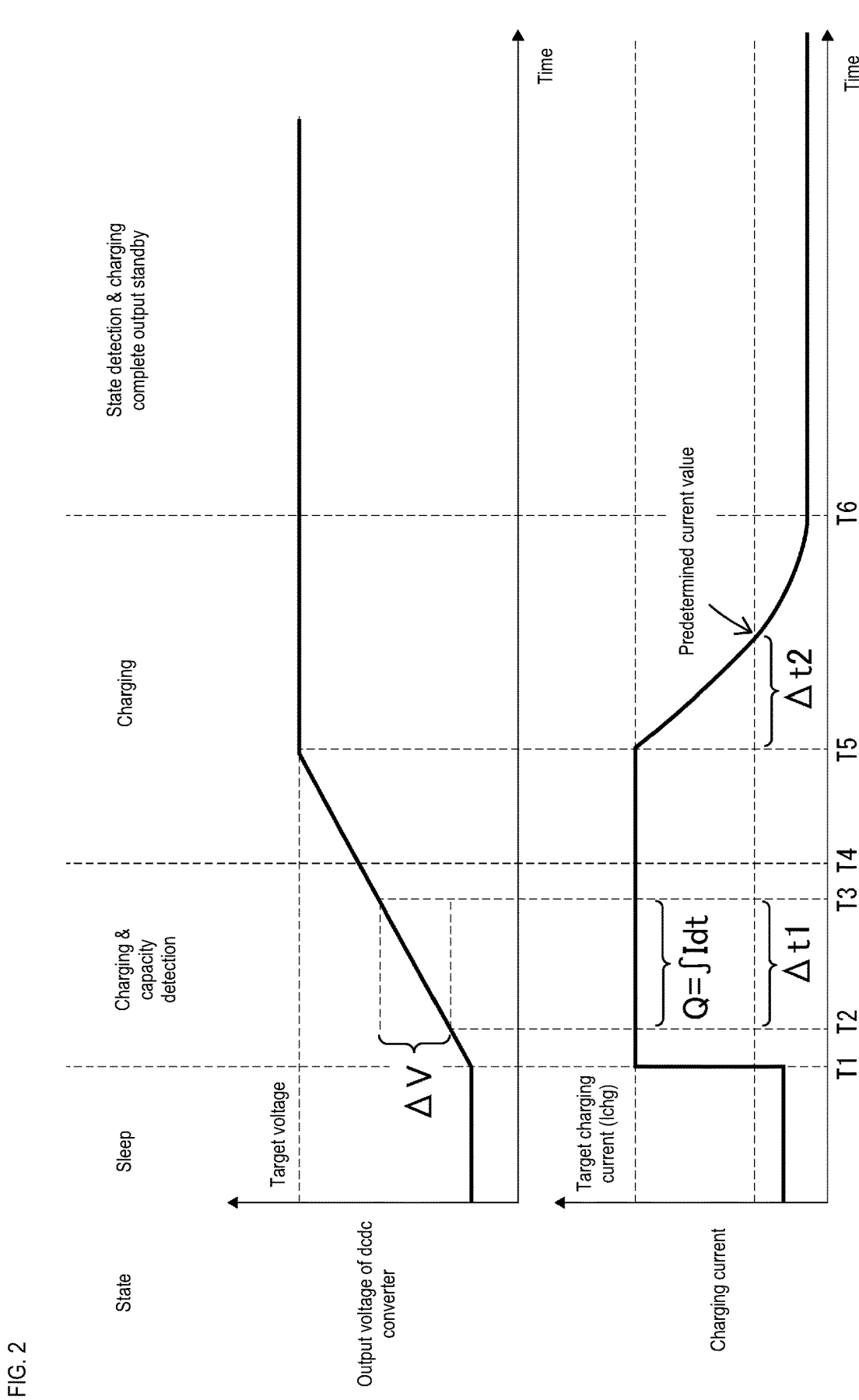
FIG. 2 is a graph showing an example of the changes over time of the output voltage of a DC-DC converter and the charging current supplied to the power storage unit in the in-vehicle power source system of the first embodiment.

The following describes how the internal resistance of the power storage unit 21 is detected by the internal resistance detection device 30, with use of FIG. 2.

In response to a predetermined charging condition being established, the control unit 34 is brought into a start-up state from a sleep state and causes the DC-DC converter 31 to perform constant current operation (constant current operation in which the charging current is output at the target charging current). An example of "a predetermined charging condition being established" may be "the starting switch (such as an ignition switch) of a vehicle having been switched from off to on". When a predetermined charging condition is established, power is supplied from the power source unit 11 to the load 12 and the power storage unit 21 by the switch 14 operating in conjunction and switching from off to on. In the example shown in FIG. 2, the output voltage of the DC-DC converter 31 before constant current operation is lower than the target voltage, and a value that corresponds to the charging voltage of the power storage unit 21 is detected by the voltage detection unit 33. Also, the charging current of the DC-DC converter 31 before constant current operation is lower than the target charging current. As shown in FIG. 2, once a predetermined charging condition is established at a time T1 and constant current operation of the DC-DC converter 31 is started, the DC-DC converter 31 raises the output voltage to the target voltage by performing constant current operation output at a target charging current Ichg.

As shown in FIG. 2, the output voltage of the DC-DC converter 31 continues to rise from the time T1 until a time T5, at which the output voltage reaches the target voltage. Then, between the time T1 and a time T4, the control unit 34 performs control to detect the capacity of the power storage unit 21. Specifically, during a time (a predetermined capacity detection time $\Delta t1$) from a time T2 (the time when a small amount of time has passed from the time T1) to a time T3, the control unit 34 detects a capacity C of the power storage unit 21 based on the change in the output voltage of the DC-DC converter 31 and the charging current supplied to the power storage unit 21. While the capacity detection time $\Delta t1$ is passing, the charging current remains at Ichg (specified charging current), and an electric charge amount Q, which is stored in the power storage unit 21 as the capacity detection time Δt1 passes, is calculated by integrally calculating the charging current Ichg within the span of the time T2 to the time T3. The output voltage that increases as the capacity detection time Δt1 passes is denoted as ΔV, and therefore the capacity C of the power storage unit 21 is calculated by dividing Q by ΔV.

Once the output voltage reaches the target voltage at the time T5 during constant current operation by the DC-DC converter 31, the control unit 34 causes the DC-DC converter 31 to perform constant voltage operation. That is to say, when the output voltage reaches the target voltage, the DC-DC converter 31 controls the power such that the charging current is lowered by performing constant voltage operation that fixes the output voltage at the target voltage. In this way, the charging current of the power storage unit 21 decreases from the time T5. The control unit 34 performs control to detect the internal resistance of the power storage unit 21 when the DC-DC converter 31 starts constant voltage operation. First, the control unit 34 measures a drop time Δt2, which is the amount of time that passes from the time (T5) that constant voltage operation of the DC-DC converter 31 starts to the time when the charging current drops to a predetermined current value. Here, a "predetermined current value" is a current value that is lower than the target charging current, and is pre-set and stored in a memory or the like. The control unit 34 then calculates an internal resistance R of the power storage unit 21 based on the target charging current Ichg, the drop time Δt2, and the capacity C of the power storage unit 21 calculated during constant current operation. Specifically, the control unit 34 uses a formula I=Ichg×exp(−Δt2/RC) indicating a predetermined current value I to calculate the internal resistance R based on the predetermined current value I that is pre-set, the target charging current Ichg, the drop time Δt2, and the capacity C of the power storage unit 21 calculated during constant current operation. In this way, it is possible to accurately calculate the internal resistance R from the formula I mentioned above by measuring the drop time Δt2 for the pre-set predetermined current value I to be detected.

Once the power storage unit 21 finishes being charged at a time T6 after the internal resistance R is detected, the control unit 34 goes into a standby state from the time T6.

Figure 3:
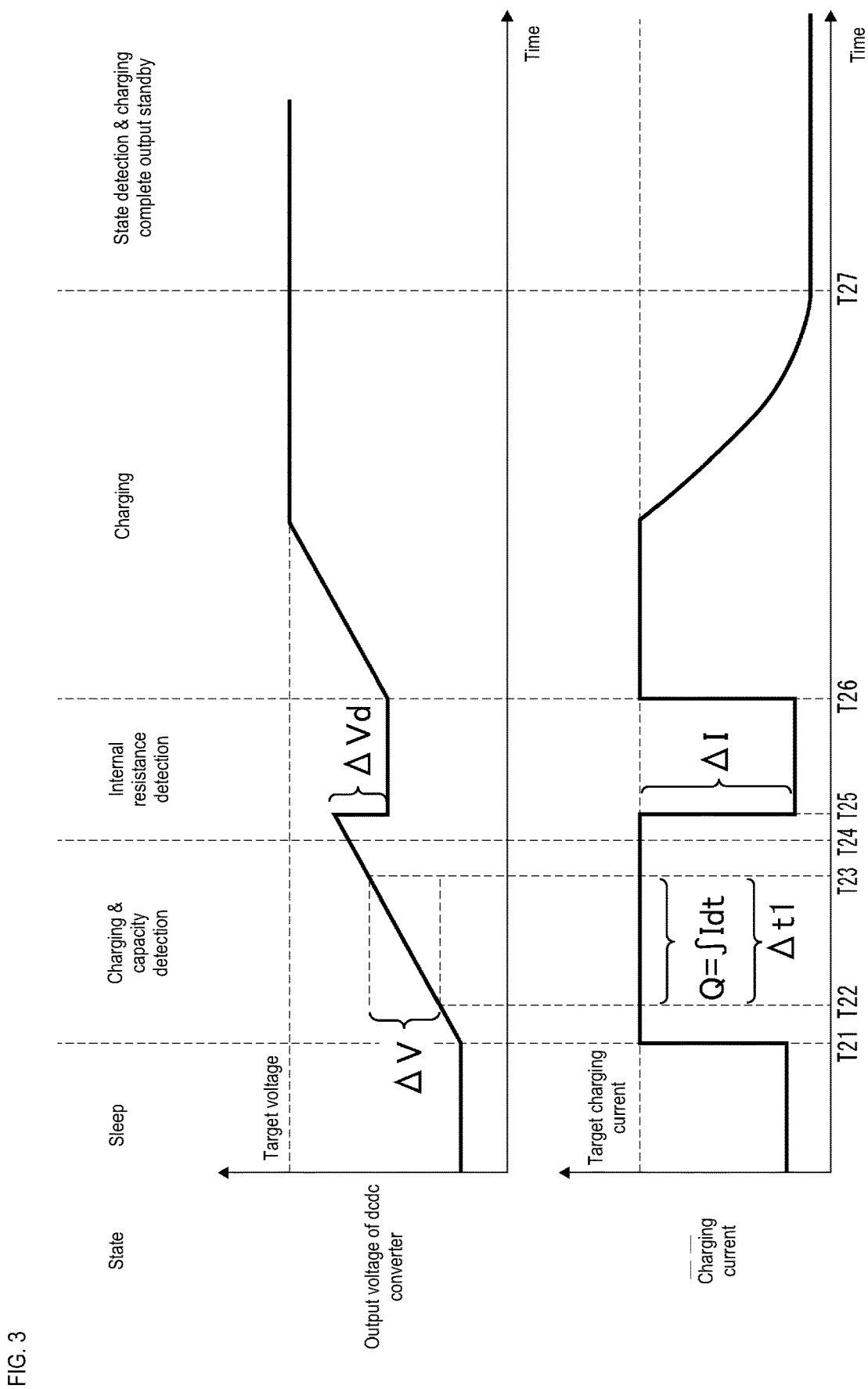
FIG. 3 is a graph showing an example of the changes over time of the output voltage of a DC-DC converter and the charging current supplied to the power storage unit in the in-vehicle power source system of a conventional example.

FIG. 3 is a graph showing an example of the changes over time of the output voltage of a DC-DC converter 31 and the charging current in an in-vehicle power source system of a conventional example. In the conventional example, for example, processing to detect the internal resistance is performed during constant current operation in which a constant charging current is supplied to a power storage unit. That is to say, the supply of charging current is stopped when the output voltage has increased (at a time T25 in FIG. 3), and the internal resistance of the power storage unit is calculated based on a reduction value ΔVd of the output voltage and a reduction value ΔI of the charging current occurring at that time. Specifically, the value of the internal resistance is calculated by dividing ΔVd by ΔI. Then, after a predetermined amount of time has passed (when a time T26 is reached) from the time T5, the charging of the power storage unit is restarted.

In this way, with the in-vehicle power source system of the conventional example, constant current operation of the power source system is interrupted and the output voltage is lowered by processing being performed to detect the internal resistance before the output voltage of the DC-DC converter 31 reaches the target voltage. For this reason, the time it takes until the output voltage reaches the target voltage is made longer by the amount of time it takes to perform processing to detect the internal resistance. On the other hand, with the system 10 of the First Embodiment, after constant voltage operation has been started by the DC-DC converter 31, constant voltage operation is performed while processing is performed (calculation processing using a formula that shows the predetermined current value I) to detect the internal resistance. For this reason, it is possible to use the time in which constant voltage operation is performed by the DC-DC converter 31 to detect the internal resistance of the power storage unit 21. In this way, unlike the system of the conventional example, there is no need to perform control to detect the internal resistance of the power storage unit during constant current operation of the DC-DC converter 31, and there is no need to secure time to perform such control. Accordingly, it is possible to shorten the time needed to cause the DC-DC converter 31 to perform constant current operation and constant voltage operation and complete the charging of the power storage unit 21.

Also, in the processing for detecting the internal resistance, the control unit 34 detects the capacity of the power storage unit 21 during constant current operation before constant voltage operation by the DC-DC converter 31. For this reason, it is possible to perform capacity detection that reflects the state (temperature characteristics and the like) of the power storage unit 21 immediately before detecting the internal resistance thereof and is highly accurate. Also, it is possible to more accurately detect the internal resistance of the power storage unit 21 by using the capacity thereof that is precisely detected.

Next, examples of the effects of the present configuration will be described.

The control unit 34 of the internal resistance detection device 30 described above detects the internal resistance R of the power storage unit 21 based on the target charging current Ichg during constant current operation by the DC-DC converter 31, the drop time Δt2, which is the time that passes from when constant voltage operation starts to when the charging current drops to a predetermined current value, and the capacity C of the power storage unit. For this reason, the target charging current Ichg during constant current operation by the DC-DC converter 31, the drop time Δt2, which is the time that passes from when constant voltage operation starts to when the charging current drops to a predetermined current value, and the capacity C of the power storage unit can be reflected and the internal resistance R of the power storage unit 21 can be accurately detected.

Also, the control unit 34 detects the internal resistance R of the power storage unit 21 based on the drop time Δt2 and the current that is detected after constant voltage operation is started by the DC-DC converter 31, and therefore the control unit 34 can use the time of constant voltage operation performed by the DC-DC converter 31 to detect the internal resistance R of the power storage unit 21. Thus, before the power storage unit 21 is charged or while the power storage unit 21 is being charged, there is no need to perform control to detect the internal resistance R of the power storage unit 21, and there is no need to secure time to perform such control. In this way, it is possible to shorten the time needed to cause the DC-DC converter 31 to perform constant current operation and constant voltage operation and complete the charging of the power storage unit 21.

Accordingly, the internal resistance detection device 30 can detect the internal resistance of the power storage unit 21 efficiently and accurately.

Also, the control unit 34 detects the internal resistance R of the power storage unit 21 by using a formula I=Ichg× exp($-\Delta t2/RC$), which is a formula of the current detected by the current detection unit 32 when the drop time has passed, where Ichg is the target charging current, $\Delta t2$ is the drop time, C is the capacity of the power storage unit, and R is the internal resistance of the power storage unit.

In this way, in the detection of the internal resistance R of the power storage unit 21, it is possible to more accurately detect the internal resistance of the power storage unit 21 by using I=Ichg×exp($-\Delta t2/RC$), which is a formula of the current detected by the current detection unit 32 when the drop time $\Delta t2$ has passed after the DC-DC converter 31 starts constant voltage operation.

Also, the internal resistance detection device 30 is configured to include a voltage detection unit 33 configured to detect the output voltage of the DC-DC converter 31. The internal resistance detection device 30 is configured to include a capacity detection unit 34 configured to detect the capacity of the power storage unit 21 based on changes in the output voltage detected by the voltage detection unit 33 due to a predetermined capacity detection time passing when the DC-DC converter 31 is performing constant current operation, and the charging current that is detected by the current detection unit 32 while the capacity detection time passes.

The control unit 34 detects the internal resistance R of the power storage unit 21 based on the target charging current Ichg, the drop time $\Delta t2$, and the capacity C of the calculated power storage unit 21.

In this way, during constant current operation before constant voltage operation performed by the DC-DC converter 31, the capacity of the power storage unit 21 can be detected by the control unit 34 based on the change of the output voltage detected by the voltage detection unit 33 and the current detected by the current detection unit 32. For this reason, it is possible to perform capacity detection that reflects the state of the power storage unit 21 immediately before detecting the internal resistance thereof and is highly accurate. Also, it is possible to more accurately detect the internal resistance of the power storage unit 21 by using the capacity thereof that is precisely detected.

Other Embodiments

The present disclosure is not limited to the embodiments described above with reference to the drawings, and, for example, any of the following example embodiments can be included within the technical scope of the present disclosure.

In the first embodiment, when the internal resistance R is being detected, the control unit 34 uses the capacity of the power storage unit 21 calculated during constant current operation of the DC-DC converter 31, but configurations are also possible in which the capacity calculated during the previous internal resistance detection is used, or a capacity value is used that has been pre-set and stored on a memory or the like.

In the first embodiment, the starting switch (such as an ignition switch) of a vehicle being switched from off to on is taken "a predetermined charge starting condition being established", but the charging voltage of the power storage unit 21 falling to or below a predetermined charging voltage may also be taken as "a predetermined charge starting condition being established".

In the first embodiment, the switch 14 operates in conjunction with the starting switch of the vehicle and switches between on and off, but configurations are also possible in which the switch 14 is the starting switch (such as an ignition switch) of the vehicle.

In the first embodiment, when charging is performed by the DC-DC converter 31, the control unit 34 performs control to detect the capacity of the power storage unit 21 while charging current of a constant current value is supplied to the power storage unit 21. However, configurations are also possible in which a charging current of a current value that is not constant is supplied when control is performed to detect the capacity of the power storage unit 21. With such a configuration, the electric charge amount Q stored in the power storage unit 21 is calculated by integrally calculating the charging current within a predetermined timespan.

The invention claimed is:

1. An internal resistance detection device configured to detect an internal resistance of a power storage unit in an in-vehicle power source system that includes a power source unit and the power storage unit configured to be charged based on power from the power source unit, the internal resistance detection device comprising:
   a current detection unit configured to detect a current that flows through a predetermined conduction path that is a path with which power is supplied from the power source unit to the power storage unit;
   a charging circuit unit configured to convert power from the power source unit and to supply charging current to the power storage unit; and
   an internal resistance detection portion configured to detect an internal resistance of the power storage unit, wherein
   the charging circuit unit is configured to raise an output voltage to a target voltage by performing constant current operation in which the charging current is output at a target charging current, and, when the output voltage reaches the target voltage, to control power such that the charging current is lowered by performing constant voltage operation in which the output voltage is fixed at the target voltage, and
   the internal resistance detection unit is configured to detect the internal resistance of the power storage unit based on the target charging current, a drop time, which is the time that passes from when constant voltage operation starts to when the charging current drops to a predetermined current value, and a capacity of the power storage unit.

2. The internal resistance detection unit according to claim 1, wherein the internal resistance detection unit is configured to detect the internal resistance of the power storage unit by using a formula I=Ichg×exp ($-\Delta t2/RC$), which is a formula of the current detected by the current detection unit when the drop time has passed, where Ichg is the target charging current, $\Delta t2$ is the drop time, C is the capacity of the power storage unit, and R is the internal resistance of the power storage unit.

3. The internal resistance detection device according to claim 2, further comprising:
   a voltage detection unit configured to detect the output voltage; and
   a capacity detection unit configured to detect the capacity of the power storage unit based on changes in the output voltage detected by the voltage detection unit due to a predetermined capacity detection time passing when the charging circuit unit is performing constant current operation, and the charging current that is detected by the current detection unit while the capacity detection time passes, wherein
   the internal resistance detection unit is configured to detect the internal resistance of the power storage unit based on the target charging current, the drop time, and the capacity of the power storage unit detected by the capacity detection unit.

4. The internal resistance detection device according to claim 1, further comprising:
a voltage detection unit configured to detect the output voltage; and
a capacity detection unit configured to detect the capacity of the power storage unit based on changes in the output voltage detected by the voltage detection unit due to a predetermined capacity detection time passing when the charging circuit unit is performing constant current operation, and the charging current that is detected by the current detection unit while the capacity detection time passes, wherein
the internal resistance detection unit is configured to detect the internal resistance of the power storage unit based on the target charging current, the drop time, and the capacity of the power storage unit detected by the capacity detection unit.

5. A power source device that includes the power storage unit and the internal resistance detection device according to claim 1.

6. A power source device that includes the power storage unit and the internal resistance detection device according to claim 5, wherein the internal resistance detection unit is configured to detect the internal resistance of the power storage unit by using a formula $I=I_{chg} \times \exp(-\Delta t2/RC)$, which is a formula of the current detected by the current detection unit when the drop time has passed, where $I_{chg}$ is the target charging current, $\Delta t2$ is the drop time, C is the capacity of the power storage unit, and R is the internal resistance of the power storage unit.

7. A power source device that includes the power storage unit and the internal resistance detection device according to claim 6, further comprising:
a voltage detection unit configured to detect the output voltage; and
a capacity detection unit configured to detect the capacity of the power storage unit based on changes in the output voltage detected by the voltage detection unit due to a predetermined capacity detection time passing when the charging circuit unit is performing constant current operation, and the charging current that is detected by the current detection unit while the capacity detection time passes, wherein
the internal resistance detection unit is configured to detect the internal resistance of the power storage unit based on the target charging current, the drop time, and the capacity of the power storage unit detected by the capacity detection unit.

8. A power source device that includes the power storage unit and the internal resistance detection device according to claim 5, further comprising:
a voltage detection unit configured to detect the output voltage; and
a capacity detection unit configured to detect the capacity of the power storage unit based on changes in the output voltage detected by the voltage detection unit due to a predetermined capacity detection time passing when the charging circuit unit is performing constant current operation, and the charging current that is detected by the current detection unit while the capacity detection time passes, wherein
the internal resistance detection unit is configured to detect the internal resistance of the power storage unit based on the target charging current, the drop time, and the capacity of the power storage unit detected by the capacity detection unit.

* * * * *